(12) United States Patent  (10) Patent No.: US 8,373,248 B2
Chen et al.  (45) Date of Patent: Feb. 12, 2013

(54) LINEAR-CAP VARACTOR STRUCTURES FOR HIGH-LINEARITY APPLICATIONS

(75) Inventors: Chia-Chung Chen, Keelung (TW); Chewn-Pu Jou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 189 days.

(21) Appl. No.: 12/858,291

(22) Filed: Aug. 17, 2010

(65) Prior Publication Data

US 2012/0043590 A1 Feb. 23, 2012

(51) Int. Cl.
H01L 29/08 (2006.01)
(52) U.S. Cl. ............................ 257/491; 257/E29.029
(58) Field of Classification Search .............. 257/491, 257/581, 288, 337, E29.029
See application file for complete search history.

(56) References Cited

U.S. PATENT DOCUMENTS

| | | | |
|---|---|---|---|
| 5,047,829 A * | 9/1991 | Seymour et al. | 257/656 |
| 6,825,089 B1 * | 11/2004 | Shapira et al. | 438/379 |
| 7,005,337 B2 * | 2/2006 | Berthold et al. | 438/202 |
| 7,019,384 B2 * | 3/2006 | Maget et al. | 257/595 |
| 7,579,642 B1 * | 8/2009 | Bulucea | 257/303 |
| 8,115,280 B2 * | 2/2012 | Chen et al. | 257/593 |
| 2003/0067026 A1 * | 4/2003 | Bulucea | 257/303 |
| 2003/0137796 A1 * | 7/2003 | Bulucea | 361/277 |
| 2004/0185632 A1 * | 9/2004 | Berthold et al. | 438/326 |
| 2006/0043476 A1 * | 3/2006 | Kao | 257/336 |
| 2011/0204969 A1 * | 8/2011 | Chen et al. | 327/581 |

FOREIGN PATENT DOCUMENTS

TW 247362 B 1/2006

OTHER PUBLICATIONS

Hanafi, B. et al., "A Technique for Truly Linear LC VCO Tuning, a Proof Concept," IEEE ICM—Dec. 2007, 4 pgs, Department of Electronics and Communication Engineering, Ain Shams University, Cairo, Egypt.
Kim, J. et al., "A Wide-Band CMOS LC VCO With Linearized Coarse Tuning Characteristics," IEEE Transaction Circuits and Systems—II: Express Briefs, vol. 55, No. 5, May 2008, pp. 399-403.
Kurachi, S. et al., "5-GHz Band Highly Linear VCO IC with a Novel Resonant Circuit," IEEE, 2007, pp. 285-288.

* cited by examiner

Primary Examiner — Nathan Ha
(74) Attorney, Agent, or Firm — Slater & Matsil, L.L.P.

(57) ABSTRACT

A device includes a well region over a substrate, and a heavily doped well region over the well region, wherein the well region and the heavily doped well region are of a same conductivity type. A gate dielectric is formed on a top surface of the heavily doped well region. A gate electrode is formed over the gate dielectric. A source region and a drain region are formed on opposite sides of the heavily doped well region. The source region and the drain region have bottom surfaces contacting the well region, and wherein the source region and the drain region are of opposite conductivity types.

20 Claims, 5 Drawing Sheets

LINEAR-CAP VARACTOR STRUCTURES FOR HIGH-LINEARITY APPLICATIONS

TECHNICAL FIELD

This disclosure relates generally to integrated circuit devices, and more particularly to linear-cap varactor structures for high-linearity applications.

BACKGROUND

Linear-capacitance (linear-cap) varactors are used in various applications that require capacitors with variable capacitance. For example, in phase-locked oscillators, linear-cap varactors with linear gain and low Kvco (the gain of the voltage control ring oscillator) are needed.

FIG. 1 illustrates a conventional junction capacitor 100, which includes gate dielectric 102, gate electrode 104, and N+ region 106 and P+ region 108, which are located in n-well region 110. N+ region 106 is connected to gate electrode 104. Junction 112, which forms a junction capacitor, is formed between P+ region 108 and n-well region 110. The capacitance of junction capacitor 112 can be tuned by adjusting the bias voltage applied between P+ region 108 and N+ region 106. It is observed that junction capacitor 112 can only be operated under a negative bias voltage. Further, the tuning range of the capacitance of junction capacitor 112 is low.

FIG. 2 illustrates conventional NMOS varactor 200, which includes gate dielectric 202, gate electrode 204, and N+ regions 206 and 208 that are located in n-well region 210. N+ regions 206 and 208 are interconnected. Varactor 200 includes capacitor 212 and 214 connected in series. Capacitor 212 is the capacitor having gate dielectric 202 as a capacitor insulator. Capacitor 214 is the capacitor having the depletion layer (not shown) that is directly under gate dielectric layer 202 as a capacitor insulator. It is observed that the capacitance of capacitor 214 is affected by the thickness of the depletion layer, which is further affected by the voltage applied between gate electrode 104 and N+ regions 206 and 208. The resulting capacitance is highly non-linear. Further, it is difficult to tune the capacitance sensitivity of varactor 200, wherein the capacitance sensitivity is the ratio of the change in the capacitance of varactor 200 to the change in the voltage applied between gate electrode 104 and N+ regions 206 and 208.

SUMMARY

In accordance with one aspect, a device includes a well region over a substrate, and a heavily doped well region over the well region, wherein the well region and the heavily doped well region are of a same conductivity type. A gate dielectric is formed on a top surface of the heavily doped well region. A gate electrode is formed over the gate dielectric. A source region and a drain region are formed on opposite sides of the heavily doped well region. The source region and the drain region have bottom surfaces contacting the well region, and wherein the source region and the drain region are of opposite conductivity types.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel linear-capacitance (linear-cap) varactor and the method of forming the same are provided in accordance with an embodiment. The variations and the operation of the embodiment are discussed. Throughout the various views and illustrative embodiments, like reference numbers are used to designate like elements.

Figure 3:
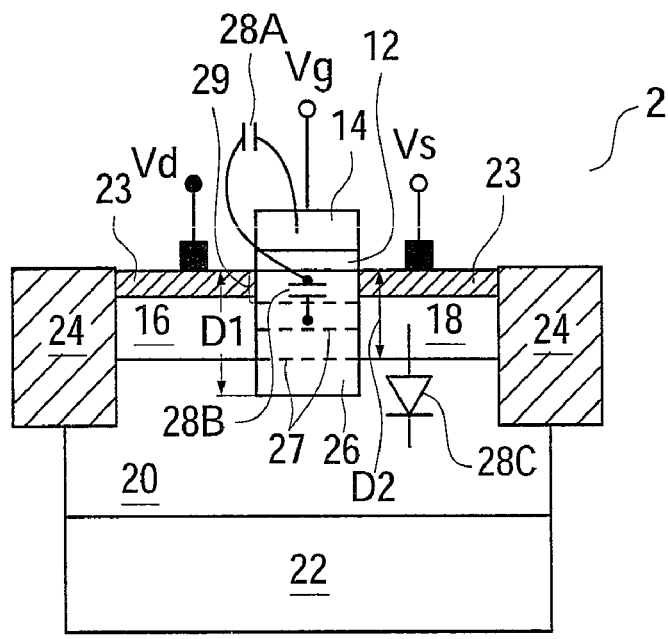
FIG. 3 illustrates a cross-sectional view of a linear-capacitance MOS varactor in accordance with an embodiment.

FIG. 3 illustrates a cross-sectional view of linear-cap MOS varactor 2, which is formed on substrate 22. In an embodiment, substrate 22 is a p-type substrate. N-well region 20 is formed in substrate 22. The doping concentration of n-well region 20 may be greater than about $10^{17}/cm^3$, for example, and may be between about $10^{17}/cm^3$ and about $10^{20}/cm^3$, or between about $10^{18}/cm^3$ and about $10^{20}/cm^3$. It is realized, however, that the values recited throughout the description are merely examples, and may be changed if different formation technologies are used. Insulation regions 24, which may be shallow trench isolation (STI) regions, are formed to define the region for forming linear-cap MOS varactor 2.

Linear-cap MOS varactor 2 includes gate dielectric 12 and gate electrode 14, wherein gate dielectric 12 is formed of a dielectric material such as silicon oxide, and gate electrode 14 is formed of a conductive material such as doped polysilicon. Heavily doped n-type region (N+ region, alternatively referred to as a drain region) 16 and heavily doped p-type region (P+ region, alternatively referred to as a source region) 18 are formed in n-well region 20, and on opposite sides of gate dielectric 12 and gate electrode 14. The bottom surfaces of N+ region 16 and P+ region 18 may contact top surfaces of portions of n-well region 20. Source/drain silicide regions 23 are formed on N+ region 16 and P+ region 18. In an embodiment, N+ region 16 has an n-type impurity concentration higher than the impurity concentration of n-well region 20. IN an exemplary embodiment, the impurity concentration of N+ region 16 is higher than about $10^{17}/cm^3$, or between about $10^{17}/cm^3$ and about $10^{21}/cm^3$, although lower impurity concentrations may be used. P+ region 18 may also have a p-type impurity concentration higher than the n-type impurity concentration of n-well region 20. In an exemplary embodiment, the impurity concentration of P+ region 18 is higher than about $10^{18}/cm^3$, or between about $10^{18}/cm^3$ and about $10^{21}/$ cm$^3$, although lower impurity concentrations may be used. Gate electrode 14, N+ region 16, and P+ region 18 may be disconnected from each other, and hence voltages Vg, Vd, and Vs may be different from each other, so that the characteristics of linear-cap MOS varactor 2 can be adjusted.

Heavily doped n-well region 26 is formed directly under gate dielectric 12. The top surface of heavily doped n-well region 26 may contact the bottom surface of gate dielectric 12. Depth D1 of heavily doped n-well region 26 may be greater than about 0.5 μm, for example, although different depths may be used. The desirable depth D1 is related to the doping concentration of heavily doped n-well region 26 and the voltages that will be applied on N+ region 16, P+ region 18, and gate electrode 14. During the operation of linear-cap MOS varactor 2, depth D1 of heavily doped n-well region 26 is greater than the thickness of depletion region 29. Further, depth D1 of heavily doped n-well region 26 may be substantially equal to, greater than, or smaller than, depths D2 of drain region 16 and source region 18. Dotted lines 27 illustrate possible positions of bottom surfaces of heavily doped n-well region 26.

Heavily doped n-well region 26 may be horizontally between, and contacting, both N+ region 16 and P+ region 18. Heavily doped n-well region 26 may be doped with phosphorous, although other n-type impurities such as arsenic, antimony, and combinations thereof, may be used. The impurity concentration of heavily doped n-well region 26 may be lower than the impurity concentrations of N+ region 16 and P+ region 18. Further, the impurity concentration of heavily doped n-well region 26 is higher than the impurity concentration of n-well region 20. In an embodiment, a ratio of the impurity concentration of heavily doped n-well region 26 to the impurity concentration of n-well region 20 is greater than about 10, greater than about 50, or even greater than about 100. An exemplary impurity concentration of heavily doped n-well region 26 is greater than about $10^{18}$/cm$^3$, greater than about $10^{19}$/cm$^3$, or between about $10^{19}$/cm$^3$ and about $10^{20}$/cm$^3$, although higher or lower impurity concentrations may be used.

Figure 6:
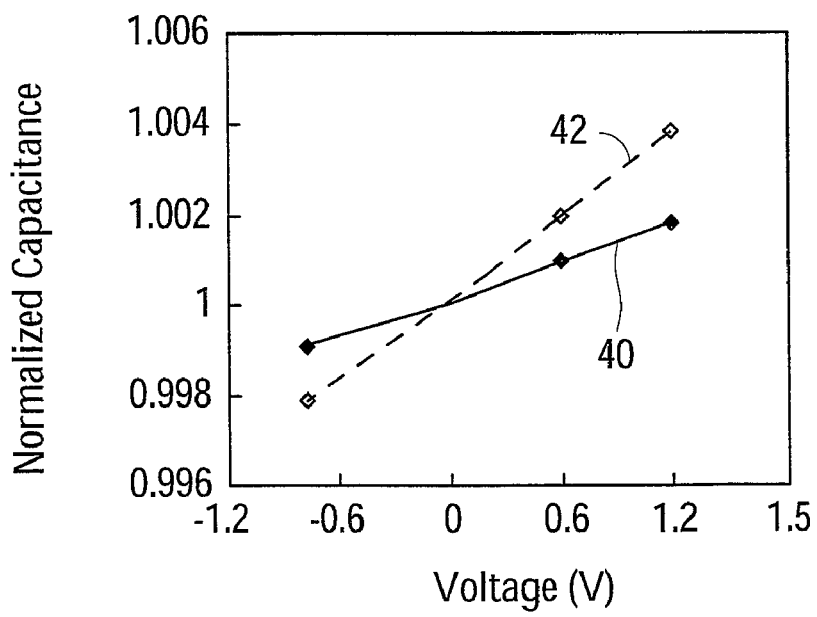

It is observed that linear-cap MOS varactor 2 includes capacitors 28A, 28B, and 28C. Capacitor 28A is the capacitor having gate dielectric 12 as the capacitor insulator. Capacitor 28B is the capacitor having depletion region 29, which is directly under gate dielectric 12, as being the capacitor insulator. Capacitor 28C is the junction capacitor between P+ region 18 and n-well region 20. Since the impurity concentration in heavily doped well region 26 is high, the capacitance of capacitor 28B is low, and the variation in the capacitance of capacitor 28B in response to the change in voltage Vg is small. Accordingly, the capacitance of the resulting linear-cap MOS varactor 2 is linear. With the addition of capacitor 28C, the capacitance sensitivity may be tuned to a greater value (as is shown in FIG. 6). The capacitance sensitivity may be expressed as ΔC/ΔV, wherein ΔC is the change in the capacitance of linear-cap MOS varactor 2, and ΔV is the change in voltage Vg applied on gate electrode 14.

Figure 4:
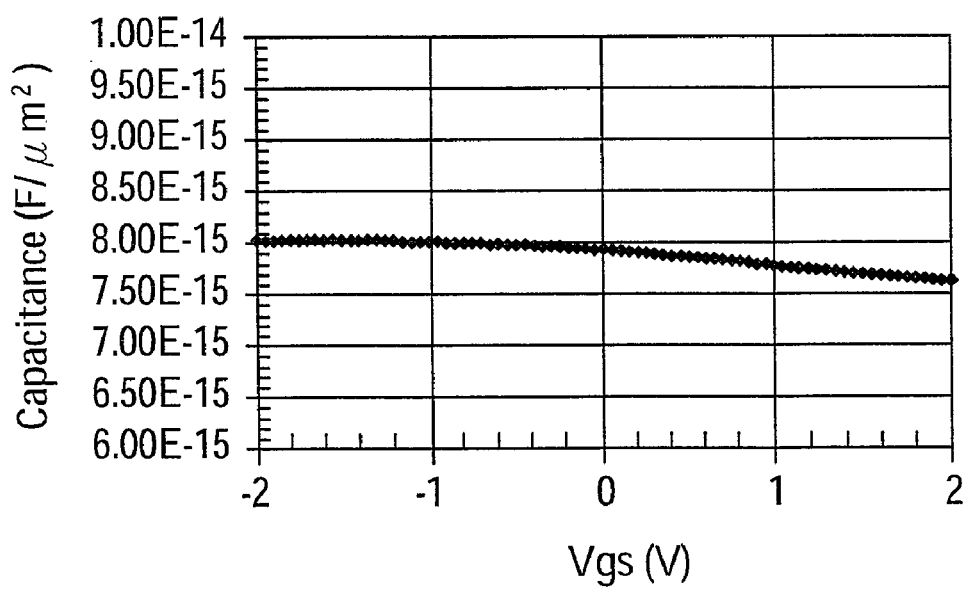
FIG. 4 illustrates a result obtained from a sample having the structure as shown in FIG. 3.

FIG. 4 illustrates an experiment result obtained from a sample of the embodiment, wherein the capacitances (y axis) viewed from gate electrode 14 is illustrated as a function of voltages Vgs (x axis) applied between gate electrode 14 and P+ region 18. The results reveal that the capacitances of the embodiment have a high linearity.

Figure 5:
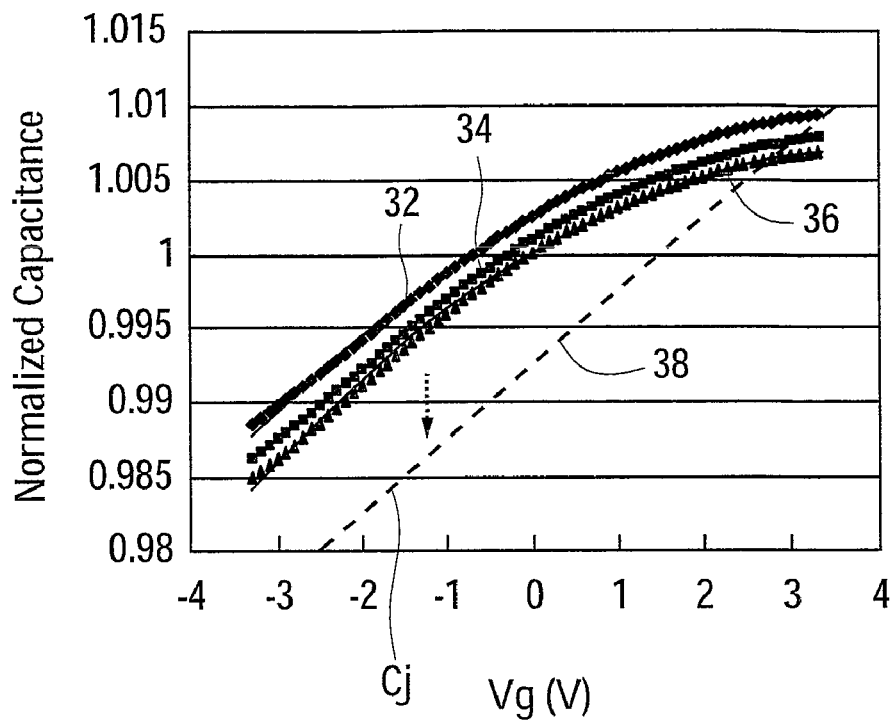
FIGS. 5 and 6 are results obtained from the embodiments.

FIG. 5 illustrates an experiment results obtained from a sample of the embodiment, wherein the normalized capacitance viewed from gate electrode 14 is illustrated as a function of bias voltage Vg applied on gate electrode 14. Lines 30, 32, and 34 are results corresponding to temperatures at 125° C., 65° C., and 25° C., respectively. Again, the results reveal that in a wide range of bias voltage Vg, a high linearity of ΔC/ΔV may be maintained. Line 38 illustrates a possible result the embodiment may achieve assuming voltage Vd (refer to FIG. 3) applied on N+ region 16 and/or voltage Vs on P+ region 18 are adjusted. It is noted that junction capacitance Cj can also be adjusted by adjusting voltages Vd and/or Vs.

Figure 1:
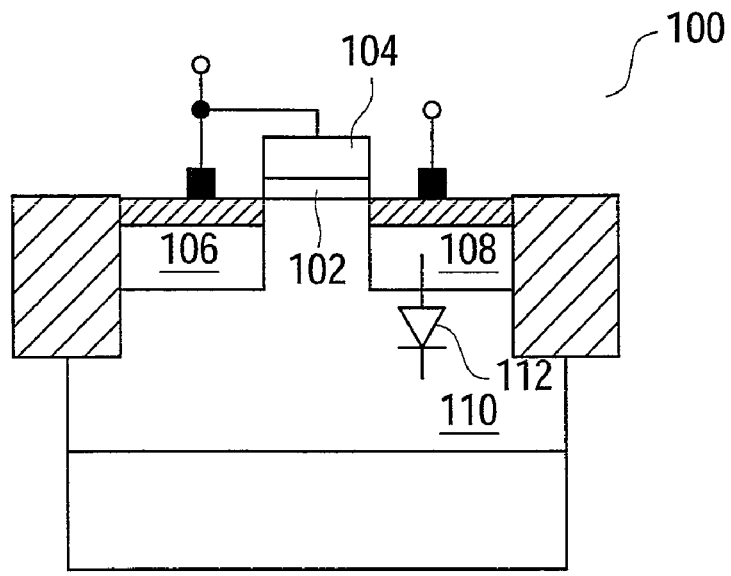
FIG. 1 illustrates a cross-sectional view of a conventional junction capacitor.
Figure 2:
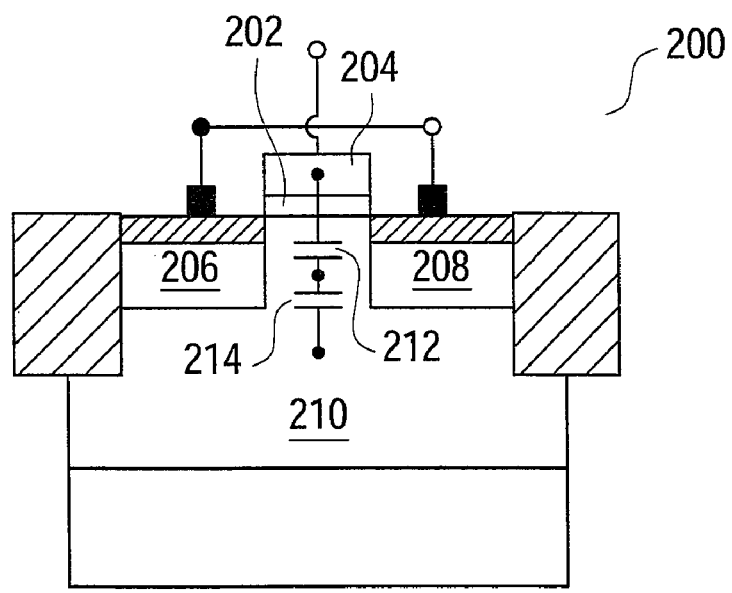
FIG. 2 illustrates a cross-sectional view of a conventional MOS varactor.

FIG. 6 illustrates the comparison between an accumulation-mode MOS varactor as shown in FIG. 2 and a sample of the embodiment, wherein the y axis represents the normalized capacitance viewed from gate electrodes, while the x axis represents the bias voltage Vg applied on gate electrodes. Solid line 40 is obtained from the accumulation-mode MOS varactor as shown in FIG. 2, while dotted line 42 is obtained from an embodiment as shown in FIG. 3. Unexpected results may be observed, which indicates that line 42 has a significantly greater slope twice as high as the slope of line 40. This indicates that the embodiment has a high capacitance sensitivity of ΔC/ΔV. This is desirable in many applications since a significant change of capacitance can be achieved by slightly adjusting controlling voltages Vg.

Figure 7:
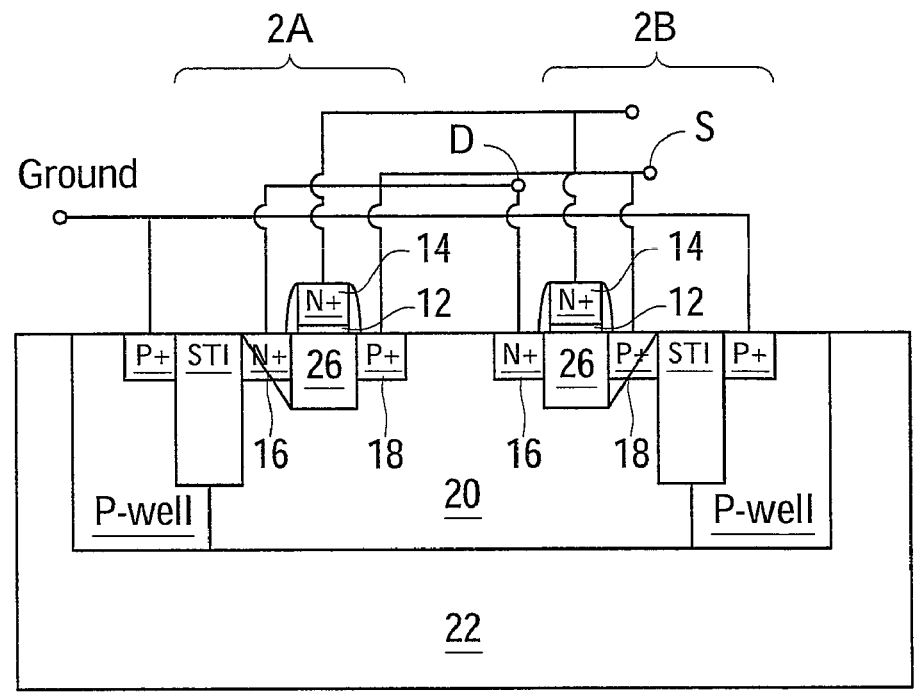
FIG. 7 illustrates a dual linear-capacitance MOS varactor structure.
Figure 8:
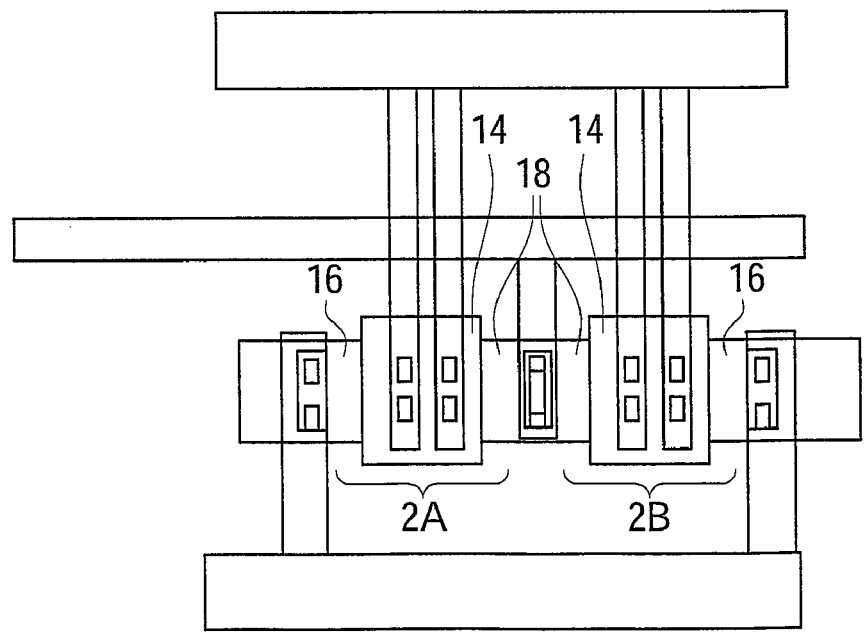
FIG. 8 illustrates an exemplary layout of the structure shown in FIG. 7.

FIGS. 7 and 8 illustrate a cross-sectional view and a top view, respectively, of a dual linear-cap MOS varactor including two linear-cap MOS varactor units 2A and 2B connected in parallel. The respective regions may be found by comparing to FIG. 3.

Figure 9:
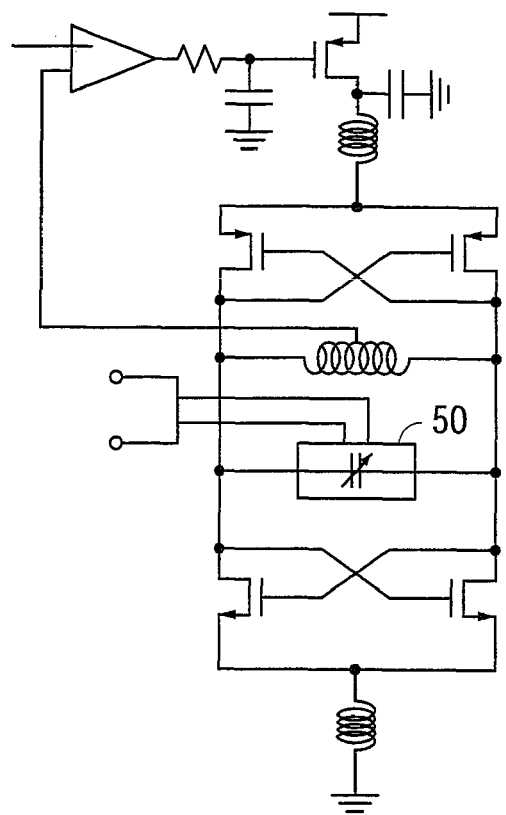
FIGS. 9 and 10 illustrates a switch capacitor voltage-controlled oscillator (VCO) incorporating embodiments of the present disclosure.
Figure 10:
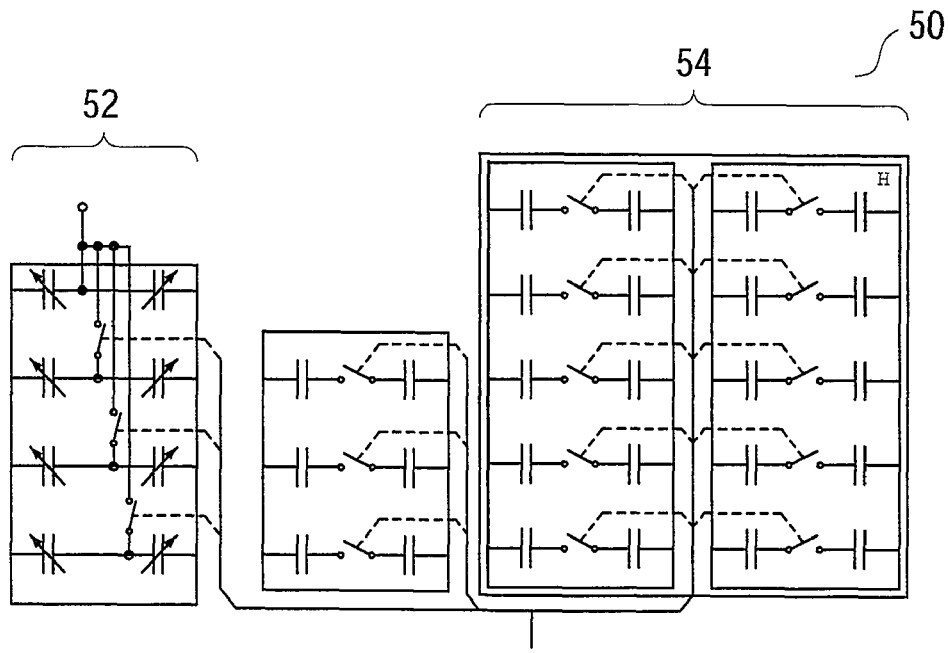

The embodiments may be used in various applications. FIG. 9 illustrates a switch capacitor voltage-controlled oscillator (VCO), which includes capacitor bank 50. The detailed structure of capacitor bank 50 is illustrated in FIG. 10, which shows that capacitor bank 50 further includes varactor bank 52, whose capacitances are relatively low, and linear-cap bank 54, whose capacitances are relatively high. Varactor bank 52 has a small capacitance value, and may be used as a radio-frequency (RF) device. Linear-cap bank 54 may be used as a decoupling capacitor. Each of the capacitors in varactor bank 52 and linear-cap capacitor bank 54 may have the structure as shown in FIG. 3.

Although the above-discussed embodiments illustrate linear-cap NMOS varactors, one skilled in the art will realize that the teaching is readily available for the formation of linear-cap PMOS varactors, with the conductivity types of well regions 20 and 26 inverted.

Linear-cap varactors in accordance with embodiments have a high linearity. Further, the capacitance sensitivity ΔC/ΔV is adjustable. Accordingly, the linear-cap varactors may be used in various applications.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addi-

What is claimed is:

1. A device comprising:
   a substrate;
   a well region of a first conductivity type over the substrate;
   a heavily doped well region of the first conductivity type over the well region;
   a gate dielectric on a top surface of the heavily doped well region;
   a gate electrode over the gate dielectric; and
   a source region and a drain region on opposite sides of the heavily doped well region, wherein the source region and the drain region have bottom surfaces contacting the well region, and wherein the source region and the drain region are of opposite conductivity types.

2. The device of claim 1, wherein edges of the source region and the drain region both contact the heavily doped well region.

3. The device of claim 1, wherein a bottom surface of the gate dielectric contacts a top surface of the heavily doped well region.

4. The device of claim 1, wherein the heavily doped well region has an impurity concentration higher than about $10^{17}/cm^3$.

5. The device of claim 1, wherein the heavily doped well region has an impurity concentration higher than ten times an impurity concentration of the well region.

6. The device of claim 5, wherein the impurity concentration of the heavily doped well region is higher than one hundred times the impurity concentration of the well region.

7. The device of claim 1, wherein the substrate is of a second conductivity type opposite the first conductivity type.

8. The device of claim 1, wherein the first conductivity type is n-type.

9. A device comprising:
   a p-type substrate;
   an n-well region over the p-type substrate;
   a heavily doped n-well region over and contacting the n-well region;
   a gate dielectric over the heavily doped n-well region, wherein a bottom surface of the gate dielectric contacts a top surface of the heavily doped n-well region;
   a gate electrode over the gate dielectric;
   a heavily doped p-type region directly over and contacting a first portion of the n-well region; and
   a heavily doped n-type region directly over and contacting a second portion of the n-well region, wherein the heavily doped p-type region and the heavily doped n-type region are on opposite ends of, and contacting, the heavily doped n-well region.

10. The device of claim 9, wherein the heavily doped n-well region has an impurity concentration higher than about $10^{19}/cm^3$.

11. The device of claim 9, wherein the heavily doped n-well region has an impurity concentration higher than ten times an impurity concentration of the n-well region.

12. The device of claim 11, wherein the impurity concentration of the heavily doped n-well region is higher than one hundred times the impurity concentration of the n-well region.

13. The device of claim 9, wherein a depth of the heavily doped n-well region is greater than depths of the heavily doped p-type region and the heavily doped n-type region.

14. The device of claim 9, wherein a depth of the heavily doped n-well region is substantially equal to depths of the heavily doped p-type region and the heavily doped n-type region.

15. The device of claim 9, wherein a depth of the heavily doped n-well region is less than depths of the heavily doped p-type region and the heavily doped n-type region.

16. A device comprising:
   a substrate;
   a well region of a first conductivity type over the substrate;
   a heavily doped well region of the first conductivity type over and contacting the well region;
   a first heavily doped region of the first conductive type;
   a second heavily doped region of a second conductivity type opposite the first conductivity type, wherein the heavily doped well region is between the first and the second heavily doped regions;
   a gate electrode directly over the heavily doped well region; and
   a gate dielectric between the gate electrode and the heavily doped well region.

17. The device of claim 16, wherein the first and the second heavily doped regions both contact the heavily doped well region.

18. The device of claim 16, wherein a bottom surface of the gate dielectric contacts a top surface of the heavily doped well region.

19. The device of claim 16, wherein the heavily doped well region has an impurity concentration higher than about $10^{19}/cm^3$.

20. The device of claim 16, wherein each of the first and the second heavily doped regions comprises a bottom surface contacting the well region.

* * * * *